United States Patent
Yamada

(10) Patent No.: US 7,647,538 B2
(45) Date of Patent: Jan. 12, 2010

(54) TEST APPARATUS AND ELECTRONIC DEVICE FOR GENERATING TEST SIGNAL BY USING REPEATED INTERVAL IN A TEST INSTRUCTION STREAM

(75) Inventor: Tatsuya Yamada, Tokyo (JP)

(73) Assignee: Advantest Corporation, Tokyo (JP)

( * ) Notice: Subject to any disclaimer, the term of this patent is extended or adjusted under 35 U.S.C. 154(b) by 282 days.

(21) Appl. No.: 11/689,489

(22) Filed: Mar. 21, 2007

(65) Prior Publication Data

US 2008/0235549 A1  Sep. 25, 2008

(51) Int. Cl.
G06F 11/00 (2006.01)
G06F 13/00 (2006.01)

(52) U.S. Cl. .................. 714/738; 714/35; 711/113; 711/118

(58) Field of Classification Search .................. None
See application file for complete search history.

(56) References Cited

U.S. PATENT DOCUMENTS

| | | | | | |
|---|---|---|---|---|---|
| 5,838,694 | A | * | 11/1998 | Illes et al. | 714/738 |
| 5,991,902 | A | * | 11/1999 | Yoshida | 714/710 |
| 6,009,546 | A | * | 12/1999 | Kuglin et al. | 714/738 |
| 6,092,225 | A | * | 7/2000 | Gruodis et al. | 714/724 |

FOREIGN PATENT DOCUMENTS

| | | |
|---|---|---|
| JP | 02-069685 | 3/1990 |
| JP | 08094724 | 4/1996 |
| JP | 2002-521698 | 7/2002 |

* cited by examiner

*Primary Examiner*—Christine T Tu
(74) *Attorney, Agent, or Firm*—Jianq Chyun IP Office

(57) ABSTRACT

There is provided a test apparatus that tests a device under test. The test apparatus includes a pattern memory that stores a test instruction stream determining a test sequence for testing the device under test, an interval register that stores a repeated interval in response to the fact that the repeated interval showing at least one instruction to be repeatedly executed in the test instruction stream has been specified, an instruction cache that caches the test instruction stream read from the pattern memory, a memory control section that reads the test instruction stream from the pattern memory and writes the read stream into the instruction cache, a pattern generating section that sequentially reads and executes instructions included in the test instruction stream from the instruction cache and generates a test pattern corresponding to the executed instruction, and a signal output section that generates a test signal based on the test pattern and supplies the generated signal to the device under test. The pattern generating section repeatedly executes an instruction stream within the repeated interval in the test instruction stream when the repeated interval is stored on the interval register.

9 Claims, 14 Drawing Sheets

SEQUENCE DATA
(TEST INSTRUCTION STREAM)

| | | |
|---|---|---|
| XXXX | NOP | |
| XXXX | NOP | |
| ... | | |
| XXXX | JMP | X |
| ... | | |
| XXXX | IDXI | Y |
| ... | | |
| XXXX | EXIT | |

FIG. 5

TEST APPARATUS AND ELECTRONIC DEVICE FOR GENERATING TEST SIGNAL BY USING REPEATED INTERVAL IN A TEST INSTRUCTION STREAM

BACKGROUND

1. Field of the Invention

The present invention relates to a test apparatus and an electronic device. More particularly, the present invention relates to a test apparatus that tests a device under test and an electronic device including a test circuit that tests a circuit under test.

2. Related Art

A test apparatus for testing a device under test such as a semiconductor has been known. The test apparatus supplies a test signal with a predetermined logical pattern to the device under test, and detects a signal output from the device under test in accordance with this test signal. Then, the test apparatus compares the detected signal and an expected value to decide the good or bad of the device under test.

The test apparatus includes a main memory such as DRAM that stores sequence data (a test instruction stream) determining a test sequence for testing the device under test, a cache memory that temporarily stores a test instruction stream, a pattern generator that sequentially generates a test pattern, and a test signal output section that outputs a test signal with logic according to the test pattern. The pattern generator sequentially reads instructions from the sequence data stored on the cache memory, and executes the read instructions. Then, the pattern generator reads pattern data corresponding to the executed instructions from the memory, and sequentially outputs the read pattern data as test patterns. According to this, the test apparatus can supply a test signal with a predetermined logical pattern to the device under test.

Moreover, the main memory can store a plurality of sequence data. In this case, the pattern generator selects one-by-one data out of the plurality of sequence data stored on the main memory in accordance with a list by which execution order of sequence data is determined, and sequentially executes them.

Here, the pattern generator can set a repeated interval on the list by which execution order is determined, in order to repeatedly execute the predetermined number of sequence data (Japanese Patent Application Publication No. 1996-094724). However, since execution order is prescribed in sequence data unit on the list, it was difficult to set a repeated interval so that the pattern generator starts from a halfway instruction of sequence data and ends at a halfway instruction of the other sequence data.

Moreover, the pattern generator can insert a branch instruction into sequence data to repeatedly execute an instruction stream. However, since an instruction stream is closed every sequence data even if the branch instruction is inserted, a process cannot be moved to the other sequence data. Therefore, it was difficult to set a repeated interval so that the pattern generator starts from a halfway instruction of sequence data and ends at a halfway instruction of the other sequence data.

SUMMARY

Therefore, it is an object of some aspects of the present invention to provide a test apparatus and an electronic device that can solve the foregoing problems. The above and other objects can be achieved by combinations described in the independent claims. The dependent claims define further advantageous and exemplary combinations of the present invention.

That is, according to the first aspect of the present invention, there is provided a test apparatus that tests a device under test. The test apparatus includes: a pattern memory that stores a test instruction stream determining a test sequence for testing the device under test; an interval register that stores a repeated interval in response to the fact that the repeated interval showing at least one instruction to be repeatedly executed in the test instruction stream has been specified; an instruction cache that caches the test instruction stream read from the pattern memory; a memory control section that reads the test instruction stream from the pattern memory and writes the read stream into the instruction cache; a pattern generating section that sequentially reads and executes instructions included in the test instruction stream from the instruction cache and generates a test pattern corresponding to the executed instruction; and a signal output section that generates a test signal based on the test pattern and supplies the generated signal to the device under test, in which the pattern generating section repeatedly executes an instruction stream within the repeated interval in the test instruction stream when the repeated interval is stored on the interval register.

According to the second aspect of the present invention, there is provided an electronic device. The electronic device includes: a circuit under test; and a test circuit that tests the circuit under test, and the test circuit includes: a pattern memory that stores a test instruction stream determining a test sequence for testing the circuit under test; an interval register that stores a repeated interval in response to the fact that the repeated interval showing at least one instruction to be repeatedly executed in the test instruction stream has been specified; an instruction cache that caches the test instruction stream read from the pattern memory; a memory control section that reads the test instruction stream from the pattern memory and writes the read stream into the instruction cache; a pattern generating section that sequentially reads and executes instructions included in the test instruction stream from the instruction cache and generates a test pattern corresponding to the executed instruction; and a signal output section that generates a test signal based on the test pattern and supplies the generated signal to the circuit under test, in which the pattern generating section repeatedly executes an instruction stream within the repeated interval in the test instruction stream when the repeated interval is stored on the interval register.

The summary does not necessarily describe all necessary features of the present invention. The present invention may also be a sub-combination of the features described above.

BRIEF DESCRIPTION OF THE DRAWINGS

FIG. 5 is a view exemplary showing sequence data (a test instruction stream) stored on a primary cache 312.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
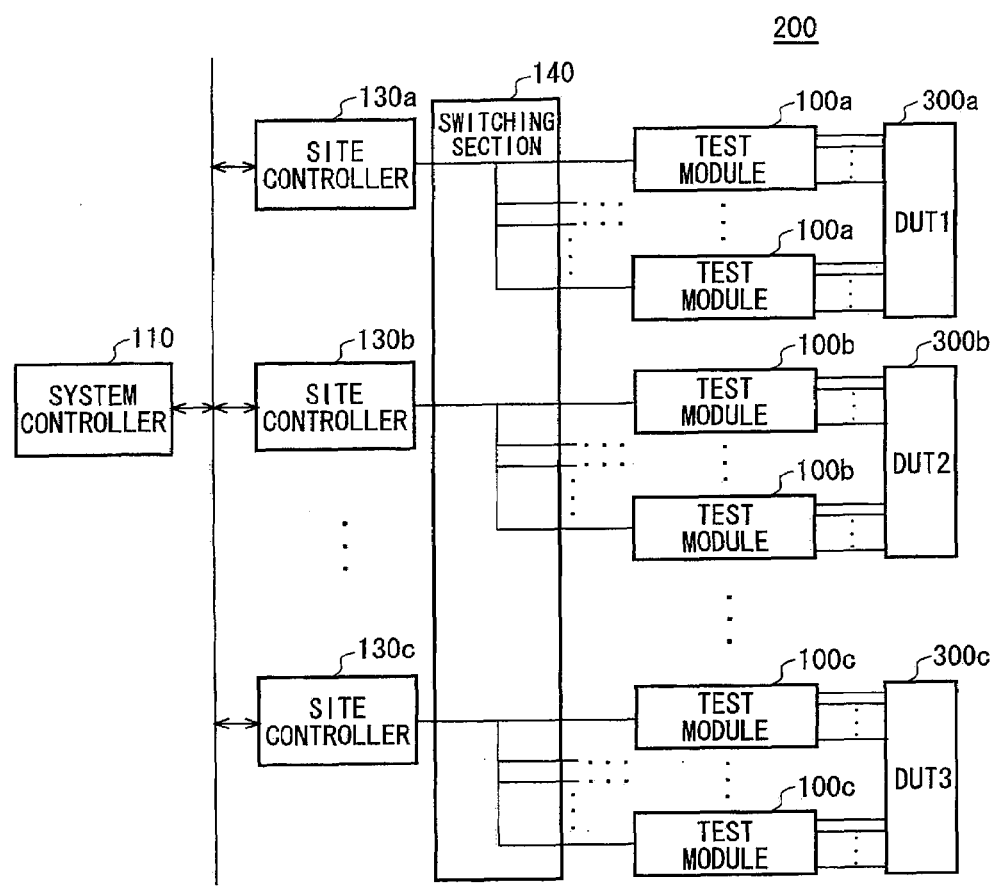
FIG. 1 is a view exemplary showing a configuration of a test apparatus 200 according to an embodiment of the present invention.

FIG. 1 is a view exemplary showing a configuration of a test apparatus 200 according to an embodiment of the present invention. The test apparatus 200 is an apparatus that tests a device under test 300 such as a semiconductor circuit, and includes a system controller 110, a plurality of site controllers 130, a switching section 140, and a plurality of test modules 100.

The system controller 110 receives a test control program, test program data, test pattern data, and so on, which are used for testing the device under test 300 by the test apparatus 200, through an outside network or the like, and stores thereon them. The plurality of site controllers 130 is connected to the system controller 110 via a communication network.

The site controllers 130a to 130c control a test for either of the device under tests 300. For example, the plurality of site controllers 130 is provided one-on-one in correspondence with the plurality of devices under test 300, and each of the site controllers 130 controls a test for the corresponding device under test 300.

In FIG. 1, the site controller 130a controls a test for the device under test 300a and the site controller 130b controls a test for the device under test 300b. Alternatively, the plurality of site controllers 130 may respectively control a test for the plurality of devices under test 300.

More specifically, the site controller 130 acquires a test control program from the system controller 110, and executes the program. Next, the site controller 130 acquires test program data (for example, sequence data to be described below) and test pattern data (for example, pattern data to be described below) to be used for testing the corresponding device under test 300 from the system controller 110 based on the test control program. Hereinafter, test program data and test pattern data are referred to as a test data stream. The test data stream may be data including at least one of the test program data and the test pattern data.

Moreover, the site controller 130 makes a module such as one or a plurality of test modules 100 store the test program data and the test pattern data to be used for testing this device under test 300 via the switching section 140. Next, the site controller 130 instructs the test module 100 via the switching section 140 to start a test based on the test program data and the test pattern data. Then, the site controller 130 receives interrupt showing that the test has been terminated, for example, from the test module 100, and makes the test module 100 perform the next test based on a test result.

The switching section 140 connects each of the plurality of site controllers 130 to one or the plurality of test modules 100 controlled by this site controller 130, and relays communication between them. Here, one predetermined site controller 130 may set the switching section 140 so as to make each of the plurality of site controllers 130 be connected to one or more the test modules 100 to be used for testing the device under test 300 by this site controller 130, based on an instruction of a user of the test apparatus 200, a test control program, and so on.

For example, in FIG. 1, the setting is performed so that the site controller 130a is connected to the plurality of test modules 10a, and a test for the device under test 300a is performed by means of these modules. Here, a configuration and an operation for testing the device under test 300 by the other site controller 130 by means of the test module 100 may be equal to a configuration and an operation for testing the device under test 300a by the site controller 130a. Hereinafter, it will be described with a focus on a configuration and an operation for testing the device under test 300a by the site controller 130a.

The test module 100a generates a timing signal at which a test signal to be used for testing the device under test 300a should be generated based on the instruction of the site controller 130a. Moreover, either of the test modules 100a may receives a test result by the other test module 100a to make the plurality of test modules 100a execute a sequence corresponding to a quality of the test result.

The plurality of test modules 100a is respectively connected to a part of a plurality of terminals of the device under test 300a, and tests the device under test 300a based on the sequence data and the pattern data stored by the site controller 130a. In case of testing the device under test 300a, the test module 100a generates a test signal from the pattern data based on the sequence data and the pattern data designated by a pattern list to be described below, and supplies the test signal to a terminal of the device under test 300a connected to this test module 100a.

Next, the test module 100a acquires an output signal output according to the operation of the device under test 300a based on the test signal, and compares the output signal with an expected value. Here, the plurality of test modules 100a may generate a test signal based on a different cycle period so as to dynamically change a cycle period of the test signal based on the sequence data and the pattern data.

Moreover, when a process of the test program data has been completed or when an abnormality occurs during the execution of the test program data, the test module 100a generates interrupt for the site controller 130a. This interrupt is notified to the site controller 130a corresponding to this test module 100a via the switching section 140, and interrupt handling is performed by a processor included in the site controller 130a.

As described above, the test apparatus 200 can be realized by open architecture and thus use various types of modules satisfying an open architecture standard. Then, the test apparatus 200 can insert and use a module such as the test module 100 into an arbitrary connection slot in the switching section 140.

In this case, a user or the like of the test apparatus 200 can change, for example, a connection mode of the switching section 140 via the site controller 130a, so that the plurality of modules to be used for testing the device under test 300 is connected to the site controller 130 for controlling a test for this device under test 300. According to this, the user of the test apparatus 200 can select an appropriate module in accordance with the number of terminals, the arrangement of terminals, the type of terminal, or the type of test of each of the plurality of devices under test 300, and mount the selected module on the test apparatus 200.

Moreover, the test apparatus 200 or the test module 100 may be a test circuit that is provided in the same electronic device along with a circuit under test to be tested. This test circuit is realized by a BIST circuit or the like of an electronic device, and diagnoses the electronic device by testing the circuit under test. According to this, this test circuit can check whether a circuit to be tested can perform a normal operation originally intended by the electronic device.

Moreover, the test apparatus 200 or the test module 100 may be a test circuit that is provided within the same board or apparatus as a circuit under test to be tested. Such a test circuit can check whether the circuit under test can perform a normal operation originally intended as described above.

Figure 2:
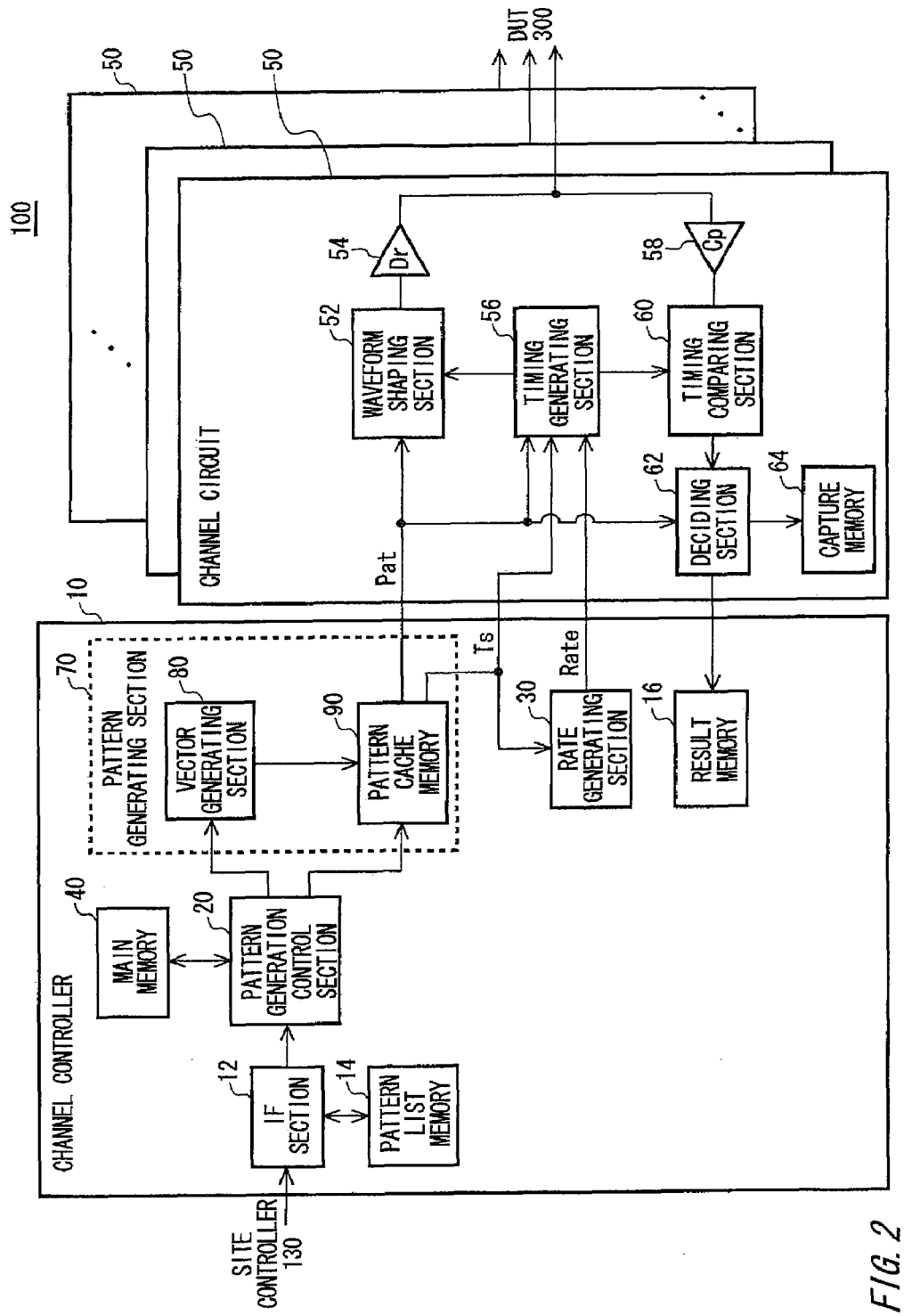
FIG. 2 is a view exemplary showing a configuration of a test module 100.

FIG. 2 is a view exemplary showing a configuration of the test module 100. The test module 100 has a channel controller 10 and a plurality of channel circuits 50. In this example, it will be explained about the function and configuration of one channel circuit 50, but other channel circuits 50 may also have the same function and configuration.

Each of the channel circuits 50 may be connected to the corresponding I/O pin of the device under test 300 to supply a test signal to this I/O pin. Moreover, each of the channel circuits 50 may measure an output signal from this I/O pin. In addition, the I/O pin of the device under test 300 may be either of an input pin or an output pin.

The channel controller 10 controls each of the channel circuits 50. For example, the channel controller 10 controls each of the channel circuits 50 to make each channel circuit generate a test signal. Moreover, the channel controller 10 controls each of the channel circuits 50 to make each channel circuit measure an output signal from the device under test 300.

Moreover, the channel controller 10 may control the other channel circuits 50 based on a measurement result by either of the channel circuits 50. For example, until the measurement result by either of the channel circuits 50 satisfies a predetermined condition, the channel controller 10 may make at least one of other channel circuits 50 repeatedly perform a predetermined operation, and make the other channel circuit 50 perform an operation to be next performed when the measurement result has satisfied the predetermined condition.

The channel controller 10 has an interface section 12, a pattern list memory 14, a result memory 16, a pattern generation control section 20, a main memory 40, a rate generating section 30, and a pattern generating section 70. The interface section 12 transfers data between the site controller 130 and the test module 100.

The main memory 40 stores a plural kind of sequence data and pattern data corresponding to the sequence data. The main memory 40 may previously store the sequence data and the pattern data provided from the site controller 130 before testing the device under test 300. Moreover, the main memory 40 may compress and store the sequence data and the pattern data.

For example, the site controller 130 may input the sequence data and the pattern data, and an instruction by which these data should be stored at a designated address on the main memory 40 into the interface section 12. The pattern generation control section 20 stores these data on the main memory 40 in accordance with the instruction received from the interface section 12.

For example, the sequence data may be data showing, for example, an instruction group to be sequentially executed. Here, one instruction in the sequence data may correspond to test data, or a plurality of instructions may correspond to test data.

The pattern data is data showing, for example, a logical value pattern, and the pattern data may be one-on-one stored in association with the plurality of instructions. For example, the sequence data may be an instruction group by which the pattern data are output in a predetermined sequence and thus test patterns are generated. Here, in the pattern data, data for one instruction may correspond to test data, or data for a plurality of instructions may correspond to test data.

At this time, the sequence data may generate test patterns using each pattern data by multiple times. For example, the sequence data may include a loop instruction, a jump instruction, or the like. The channel controller 10 can develop the corresponding pattern data by executing such sequence data, and generate test signals according to the sequence data and the pattern data. An example of the sequence data and the pattern data stored on the main memory 40 will be described below in FIG. 3.

The pattern list memory 14 stores a pattern list showing sequence by which the sequence data stored on the main memory 40 should be executed. For example, the pattern list memory 14 may store a pattern list sequentially designating addresses on the main memory 40, in which the addresses are addresses for the sequence data to be executed. The pattern list memory 14 may previously store the pattern list provided from the site controller 130 before testing the device under test 300, similarly to the main memory 40. The pattern list may be an example of the above-described test control program, or may be a part of the test control program.

When starting the test for the device under test 300, the pattern generation control section 20 reads the pattern list from the pattern list memory 14. For example, when receiving an instruction for the test start from the site controller 130, the pattern generation control section 20 may read the pattern list from the pattern list memory 14.

The pattern generation control section 20 reads the sequence data and the corresponding pattern data stored on the main memory 40 in a sequence based on the pattern list. The pattern generation control section 20 sends the read sequence data to a vector generating section 80 of the pattern generating section 70. Moreover, the pattern generation control section 20 sends the read pattern data to a pattern cache memory 90 of the pattern generating section 70.

When a predetermined space area is generated on a cache memory of the subsequent-stage circuit, FIFO, and so on, the pattern generation control section 20 may read and send the next sequence data and pattern data. In this case, the pattern generation control section 20 may read the next sequence data and pattern data and send them to all cache memories, FIFO, and so on, on which the sequence data and the pattern data should be stored, on condition that the predetermined space area is generated on these cache memories and FIFO.

The pattern generating section 70 sequentially generates test patterns based on the sequence data and the pattern data sequentially received from the pattern generation control section 20. The pattern generating section 70 according to the present example has the vector generating section 80 and the pattern cache memory 90.

As described above, the vector generating section 80 receives the sequence data from the pattern generation control section 20. The vector generating section 80 may have a sequence cache memory that stores the received sequence data on a predetermined cache entry (hereinafter, referred to as an entry). The pattern cache memory 90 receives the pattern data from the pattern generation control section 20, and stores the received data on a predetermined entry. An entry may be, for example, a storage area specified by one or a plurality of addresses.

The vector generating section 80 sequentially executes the sequence data stored on the sequence cache memory to sequentially designate addresses of the pattern cache memory 90. For example, each instruction of the sequence data may be associated with an address of the pattern data to be specified in accordance with this instruction. Then, the vector generating section 80 sequentially designates addresses for the pattern cache memory 90 in accordance with a loop instruction, a jump instruction, and so on included in the sequence data.

The pattern cache memory 90 outputs the pattern data of the addresses that are sequentially specified. By such a configuration, it is possible to generate a test pattern having a logical pattern according to the sequence data and the pattern data. Moreover, when the execution of sequence data has been terminated, the sequence cache memory and the pattern cache memory 90 may open a storage area for this sequence data and the corresponding pattern data. The sequence data may have a terminated instruction showing a termination of sequence data at the end of the instruction group.

Each of the channel circuits 50 shapes a test signal based on the test pattern output from the pattern generating section, and inputs the shaped signal into the device under test 300. Moreover, the channel circuit 50 measures an output signal from the device under test 300. The channel circuit 50 has a waveform shaping section 52, a driver 54, a timing generating section 56, a comparator 58, a timing comparing section 60, a deciding section 62, and a capture memory 64.

The waveform shaping section 52 shapes a test signal based on the test pattern generated from the pattern generating section 70. For example, the waveform shaping section 52 may generate a test signal having a logical pattern according to this test pattern. Moreover, the waveform shaping section 52 may generate a test signal in accordance with a given timing signal. For example, the waveform shaping section 52 may generate a test signal of which a logical value transits in accordance with a given timing signal.

The driver 54 inputs the test signal generated from the waveform shaping section 52 into the device under test 300. The driver 54 may output a predetermined H-level voltage when the test signal generated from the waveform shaping section 52 shows High logic and output a predetermined L-level voltage when the test signal shows Low logic, in order to convert a voltage level of the test signal into a signal level to be input into the device under test 300.

The comparator 58 may receive the output signal from the device under test 300 and compare a voltage level of the output signal and a preset reference level, in order to convert the output signal into a binary logic signal. For example, the comparator 58 may output High logic when the voltage level of the output signal is larger than the reference level and output Low logic when the voltage level of the output signal is not more than the reference level.

The timing comparing section 60 acquires a logical value of the signal output from the comparator 58 in accordance with a given strobe signal. According to this, it is possible to detect a logical pattern of the output signal.

The timing generating section 56 generates the above-described timing signal and strobe signal in accordance with a set value of a previously given timing set. For example, the timing generating section 56 may generate a timing signal and a strobe signal obtained by delaying a rate signal, which is provided from the rate generating section 30 in a period according to a timing set, in a delay amount according to a given timing set.

A timing set may be provided to the rate generating section 30 and the timing generating section 56, for example, whenever one sequence data is executed. For example, the main memory 40 may include timing set data in a part of pattern data corresponding to this sequence data. The pattern generating section 70 may set a timing set corresponding to this sequence data in the rate generating section 30 and the timing generating section 56 whenever each sequence data is executed.

The deciding section 62 compares the logical pattern detected from the timing comparing section 60 and an expectation pattern. According to this, it is possible to decide a quality of the device under test 300. The pattern generating section 70 may generate the expectation pattern. For example, an expectation pattern may be equal to a logical pattern of a test signal to be input into the device under test 300, which is included in a test pattern generated from the pattern generating section 70.

The capture memory 64 stores a decision result by the deciding section 62. For example, the capture memory 64 may store a decision result such as a pass (match) or a fail (mismatch) by the deciding section 62 every test pattern. Moreover, the capture memory 64 may select and store a decision result for a fail by the deciding section 62.

Moreover, the result memory 16 in the channel controller 10 stores a decision result for each of the channel circuits 50 by the deciding section 62. The result memory 16 may store a decision result such as a pass (match) or a fail (mismatch) by each of the deciding sections 62 in association with each channel every test pattern. Moreover, the result memory 16 may select and store a decision result for a fail by each of the deciding sections 62.

As described above, the capture memory 64 may store fail information for each test pattern every channel circuit 50. On the contrary, the result memory 16 may store fail information for each sequence data stored on the pattern list memory 14, for example, every device under test 300.

Figure 3:
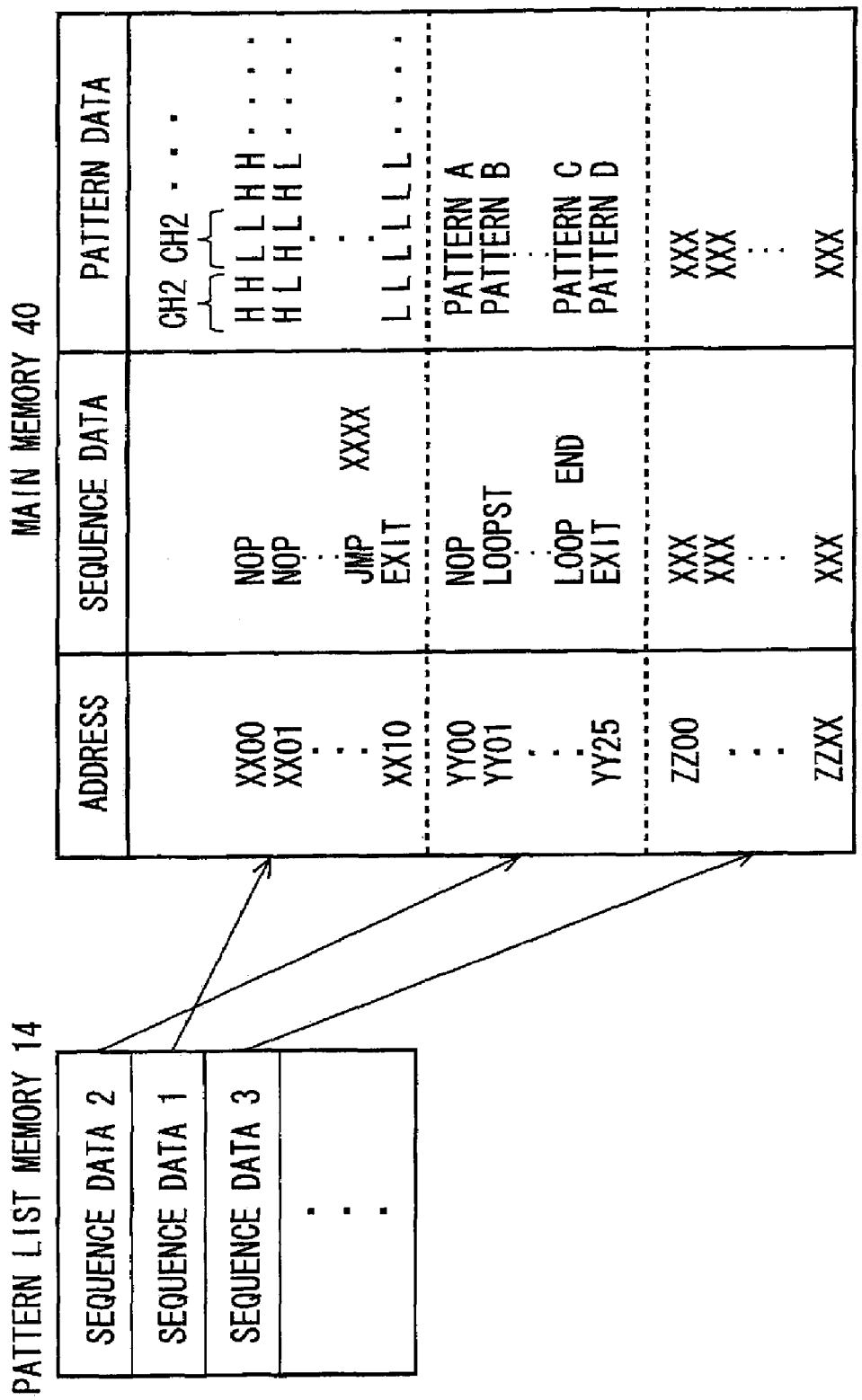
FIG. 3 is a view exemplary explaining a pattern list stored on a pattern list memory 14, sequence data stored on a main memory 40, and pattern data.

FIG. 3 is a view exemplary explaining a pattern list stored on the pattern list memory 14, sequence data stored on the main memory 40, and pattern data. As described above, the main memory 40 stores pattern data respectively corresponding to the plurality of sequence data (sequence data 1, sequence data 2, and so on).

As described above, the sequence data include a plurality of instructions. When each instruction has been executed, the pattern generating section 70 may output pattern data corresponding to this instruction. For example, the sequence data may include a NOP instruction outputting the corresponding pattern data and shifting to the next instruction, a JMP instruction outputting the corresponding pattern data and further jumping to an instruction on a predetermined address, a LOOP instruction outputting the corresponding pattern data and further repeating instructions in a designated address range by the predetermined number of times, and so on.

By executing such an instruction group, each pattern data is output in a sequence according to sequence data, and a predetermined test pattern is generated. For example, when executing the sequence data 2, the pattern generating section 70 outputs pattern data A, and then repeatedly outputs data from pattern data B to pattern data C by the number of times specified by a LOOP instruction.

Moreover, the main memory 40 may store sequence data in common with the plurality of channel circuits 50. The main memory 40 may store pattern data for each of the channel circuits 50. For example, the main memory 40 may store pattern data corresponding to the plurality of channel circuits 50 for each instruction of sequence data. In an example of FIG. 3, the main memory 40 stores pattern data corresponding to each channel circuit 50 at a different bit position of each address.

The pattern list memory 14 stores a sequence of sequence data to be executed. In an example shown in FIG. 3, the pattern list memory 14 stores a pattern list sequentially specifying sequence data 2, sequence data 1, and so on.

Moreover, in an example shown in FIG. 2, the main memory 40 that stores the sequence data and the pattern data is provided in the channel controller 10. On the contrary, in another example, the main memory 40 that stores the sequence data may be provided in the channel controller 10, and a memory that stores the pattern data for each channel circuit 50 may be provided in each channel circuit 50.

In this case, the pattern cache memory 90 may be provided in each channel circuit 50. Then, addresses sequentially designated by the vector generating section 80 may be distributed to the pattern cache memory 90 provided in each channel circuit 50.

Figure 4:
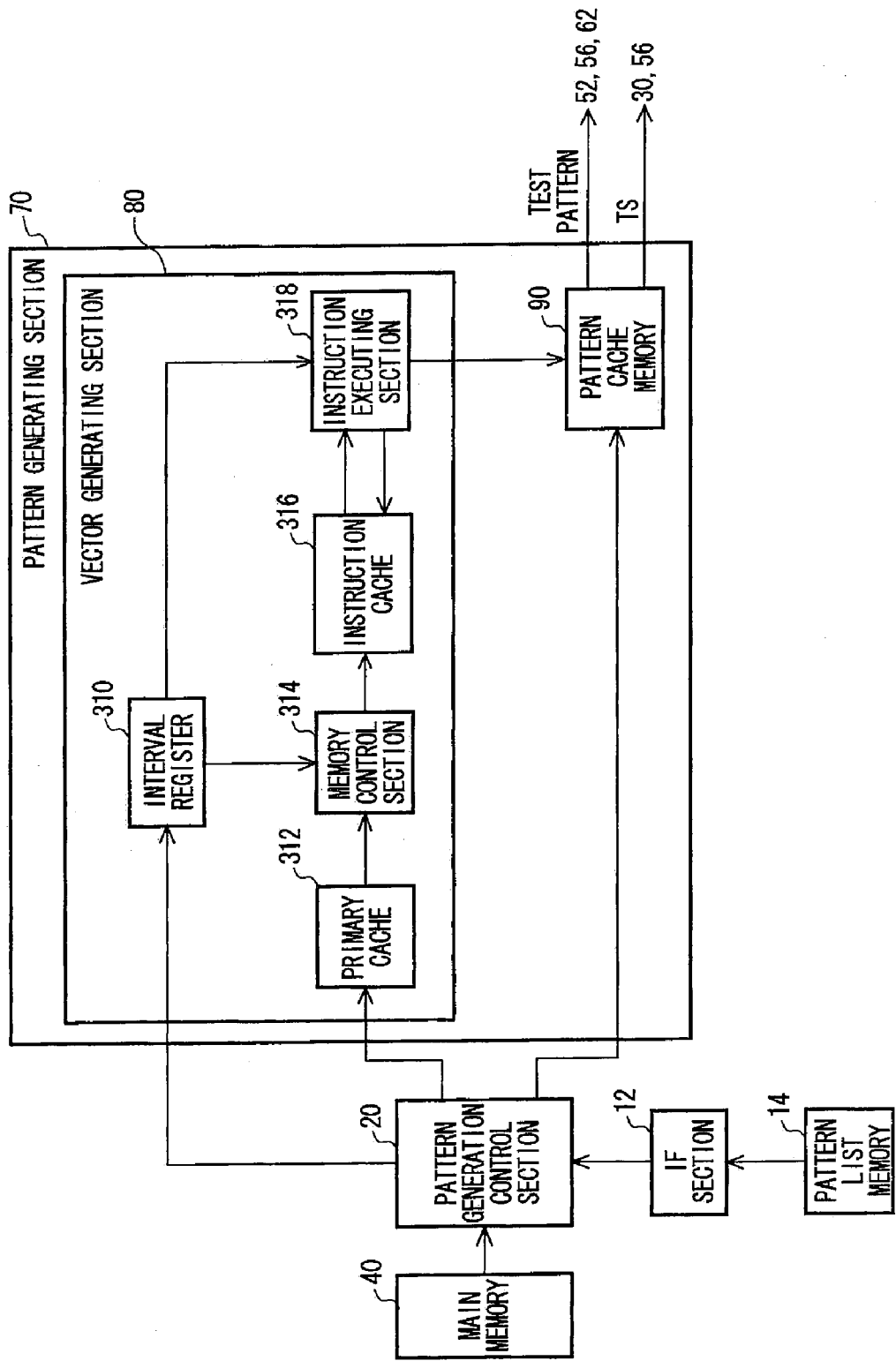
FIG. 4 is a view exemplary showing a configuration of a pattern generating section 70 according to the present embodiment along with a main memory 40 and a pattern generation control section 20.

FIG. 4 is a view exemplary showing a configuration of the pattern generating section 70 according to the present embodiment along with the main memory 40 and the pattern generation control section 20. The vector generating section 80 includes an interval register 310, a primary cache 312, a memory control section 314, an instruction cache 316, and an instruction executing section 318.

As described above, the main memory 40 stores a test instruction stream (sequence data) determining a test sequence for testing the device under test 300. Furthermore, the main memory 40 stores a test pattern stream (pattern data) including test patterns associated with each instruction included in sequence data.

The primary cache 312 included in the vector generating section 80 stores the sequence data. The primary cache 312 is an example of a pattern memory according to the present invention. The pattern cache memory 90 stores the pattern data.

The pattern generation control section 20 is an example of a transfer section according to the present invention. The pattern generation control section 20 reads a plurality of sequence data stored on the main memory 40 in accordance with a description of the pattern list, and writes the read data into the primary cache 312. The pattern generation control section 20 reads a plurality of pattern data stored on the main memory 40 in accordance with a description of the pattern list, and writes the read data into the pattern cache memory 90. In other words, the pattern generation control section 20 starts transferring a second sequence data to be executed next to a first sequence data from a forehand instruction thereof when instructions from a forehand instruction to a terminated instruction included in the first sequence data have been completely transferred from the main memory 40 to the primary cache 312. Similarly, the pattern generation control section 20 starts transferring a second pattern data corresponding to the second sequence data from a forehand test pattern thereof when test patterns from a forehand test pattern to a final test pattern in a first pattern data corresponding to the first sequence data have been completely transferred from the main memory 40 to the pattern cache memory 90.

Furthermore, when repeatedly executing consecutive instruction streams within one sequence data or consecutive instruction streams over the plurality of sequence data, the pattern generation control section 20 reads a repeated interval designating this instruction stream, for example, from the pattern list or the like, and writes the read interval into the interval register 310.

The interval register 310 stores a repeated interval in response to the fact that the repeated interval showing at least one instruction to be repeatedly executed in the sequence data has been designated. As an example, a repeated interval designated in the pattern list may be written into the interval register 310 by the pattern generation control section 20.

The memory control section 314 reads the sequence data from the primary cache 312, and writes the read data into the instruction cache 316. When the repeated interval is further stored on the interval register 310, the memory control section 314 replaces a final instruction in the repeated interval by a branch instruction or a terminated instruction.

The instruction cache 316 caches the sequence data read from the primary cache 312. Each instruction included in the sequence data cached by the instruction cache 316 is associated with a test pattern included in the pattern data stored on the pattern cache memory 90.

The instruction executing section 318 sequentially reads instructions included in the sequence data stored on the instruction cache 316 and executes the instructions. An offset showing a position of this instruction in this sequence data is allotted to each instruction included in the sequence data.

The instruction executing section 318 sequentially reads and executes instructions in accordance with the offset to execute a test sequence prescribed by this sequence data. In other words, the instruction executing section 318 starts executing instructions from an instruction of a forehand offset of the sequence data, and executes the instructions in a sequence according to the offset. More specifically, the instruction executing section 318 repeats a process for executing instructions, specifying an offset of an instruction to be next executed, which is determined in accordance with the executed instruction, reading an instruction of the specified offset from the instruction cache 316, and executing the read instruction.

When the instruction has been executed, the instruction executing section 318 converts an offset allotted to this instruction into a vector address designating a test pattern corresponding to this instruction. The instruction executing section 318 provides this vector address to the pattern cache memory 90, and causes the pattern cache memory 90 to output a test pattern corresponding to the executed instruction. The pattern cache memory 90 supplies the test pattern to the channel circuit 50. Then, the channel circuit 50 generates a test signal according to the supplied test pattern, and supplies the test signal to the device under test 300. As an example, the pattern cache memory 90 supplies a test pattern to the waveform shaping section 52, the timing generating section 56, and the deciding section 62.

Moreover, timing set information (TS) designating a set of timings for outputting the corresponding test pattern is associated with each instruction included in sequence data. When an instruction has been executed, the instruction executing section 318 makes this pattern cache memory 90 output the timing set information associated with this instruction to the rate generating section 30 and the timing generating section 56 in association with the test pattern output from the pattern cache memory 90.

The instruction executing section 318 executes the plurality of sequence data in a sequence (that is, a sequence according to a description of a pattern list) written in the instruction cache 316. In other words, the instruction executing section 318 starts executing instructions from a forehand instruction of the second sequence data to be executed next to the first sequence data when instructions from a forehand instruction to a terminated instruction included in the first sequence data have been completely executed. Furthermore, the instruction executing section 318 repeatedly executes an instruction stream within a repeated interval in sequence data when the repeated interval is stored on the interval register 310.

FIG. 5 is a view exemplary showing sequence data (a test instruction stream) stored on the primary cache 312. As an example, the sequence data may include a NOP instruction, a jump instruction (a JMP instruction), a waiting instruction (an IDXI instruction), a terminated instruction (an EXIT instruction), and so on. When a NOP instruction has been executed, the instruction executing section 318 specifies an instruction to which the following offset of the NOP instruction is allotted as an instruction to be next executed.

A forward branch instruction (a JMP instruction) that is an example of a branch instruction specifies an executed instruction prior to this JMP instruction as an instruction to be next executed, when the forward branch instruction does not satisfy (or satisfies) a specified condition. According to this, the instruction executing section 318 can again returns a process to the executed instruction and repeat the process from the executed instruction to the JMP instruction.

Furthermore, when the JMP instruction satisfies (does not satisfy) a specified condition, the JMP instruction specifies an instruction to which the following offset of this JMP instruction is allotted as an instruction to be next executed. According to this, the instruction executing section 318 can escape a loop process and advance the process to the next instruction. In addition, in the present embodiment, the instruction executing section 318 can return the process to instructions located in a predetermined range from a JMP instruction, but cannot return the process in excess of the predetermined range, in the case of executing the JMP instruction. For example, the instruction executing section 318 can return the process to instructions in a 512-word range back from a JMP instruction and cannot return the process to instructions preceding a 513 word, in the case of executing the JMP instruction. Moreover, in the present embodiment, in the case of executing a JMP instruction, the instruction executing section 318 cannot return back the process in excess of an instruction becoming a return point of another JMP instruction posterior to this JMP instruction.

A waiting instruction (an IDXI instruction) is an instruction repeatedly outputting the corresponding pattern data by the specified number of times. When executing the IDXI instruction, the instruction executing section 318 does not move a process to the next instruction while counting a designated cycle after executing this IDXI instruction. Then, when executing the IDXI instruction, the instruction executing section 318 specifies an instruction to which the following offset of this IDXI instruction is allotted as an instruction to be next executed after the designated cycle has been passed.

A terminated instruction (an EXIT instruction) is an instruction terminating the execution of sequence data. When executing the EXIT instruction, the instruction executing section 318 terminates the execution of this sequence data without specifying an instruction to be next executed. Then, the instruction executing section 318 moves the process to different sequence data to be next executed when executing the EXIT instruction.

Figure 6:
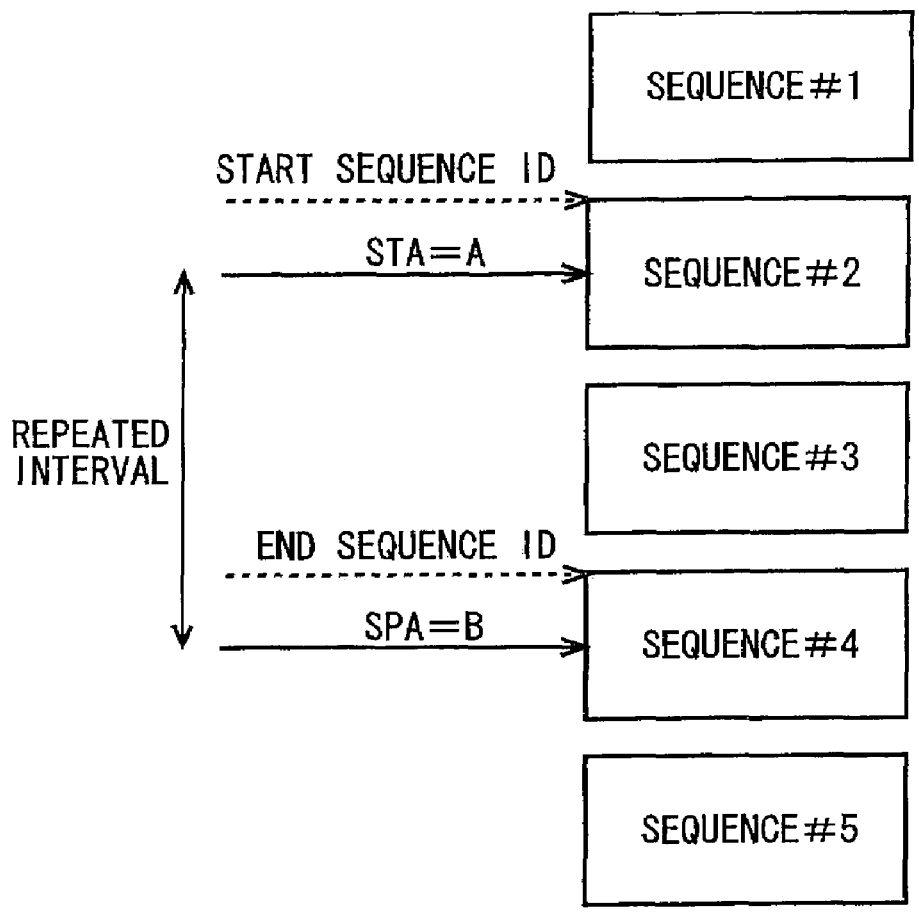
FIG. 6 is a view exemplary showing a repeated interval.
Figure 7:
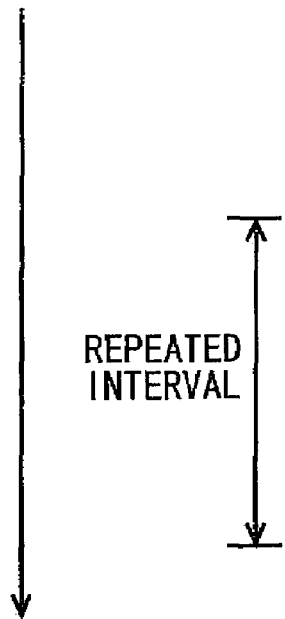
FIG. 7 is a view showing an instruction execution sequence when the repeated interval shown in FIG. 6 is specified.

FIG. 6 is a view exemplary showing a repeated interval. FIG. 7 is a view showing an instruction execution sequence when the repeated interval shown in FIG. 6 is specified.

The interval register 310 stores a forehand instruction of an instruction stream to be repeatedly executed and information specifying a final instruction of the instruction stream to be repeatedly executed as the repeated interval. As an example, the interval register 310 may store an offset (STA) of a forehand instruction of the instruction stream to be repeatedly executed, an ID (a start sequence ID) showing sequence data including this forehand instruction, an offset (SPA) of a final instruction of the instruction stream to be repeatedly executed, and an ID (an end sequence ID) showing sequence data including this final instruction. The interval register 310 may store the length of the instruction stream to be repeatedly executed in place of the SPA and the end sequence ID. Moreover, the interval register 310 may store the number of sequence data including the instruction stream to be repeatedly executed in place of the end sequence ID.

For example, as shown in FIG. 6, in case that a first to a fifth sequence data are stored on the main memory 40, the pattern generation control section 20 and the instruction executing section 318 transfer and execute instructions in a sequence as shown in FIG. 7 when STA is "A", a start sequence ID is sequence #2 indicating the second sequence data, SPA is "B", and an end sequence ID is sequence #4 indicating the fourth sequence data.

In other words, first, the pattern generation control section 20 sequentially transfers instructions, which are located between a forehand offset and a final offset of the first to the third sequence data, from the main memory 40 to the primary cache 312. Herewith, the pattern generation control section 20 sequentially transfers test patterns, which are located between a forehand offset and a final offset of the first to the third pattern data corresponding to the first to the third sequence data, from the main memory 40 to the pattern cache memory 90. Then, the instruction executing section 318 sequentially executes the instructions from the forehand offset to the final offset of the first to the third sequence data.

Next, the pattern generation control section 20 sequentially transfers instructions, which are located between a forehand offset and a Bth offset of the fourth sequence data, from the main memory 40 to the primary cache 312. Herewith, the pattern generation control section 20 sequentially transfers test patterns, which are located between a forehand offset and a Bth offset of the fourth pattern data corresponding to the fourth sequence data, from the main memory 40 to the pattern cache memory 90. Then, the instruction executing section 318 sequentially executes the instructions from the forehand offset to the Bth offset of the fourth sequence data.

Since an instruction of the Bth offset of the fourth sequence data is a final instruction in the repeated interval, the pattern generation control section 20 returns the process to an instruction of the Ath offset of the second sequence data, and again starts a transfer from the instruction. Herewith, the pattern generation control section 20 returns the process to a test pattern of the Ath offset from the head of the second pattern data, and again starts a transfer from the test pattern. Then, the instruction executing section 318 returns the process to an instruction of the Ath offset of the second sequence data, which is a forehand instruction in the repeated interval.

Next, the pattern generation control section 20 repeatedly transfers instruction streams, which are located between an instruction of the Ath offset of the second sequence data and an instruction of the Bth offset of the fourth sequence data, by the specified number of times from the main memory 40 to the primary cache 312. Herewith, the pattern generation control section 20 sequentially transfers test pattern streams, which are located between a test pattern of the Ath offset of the second pattern data and a test pattern of the Bth offset of the fourth pattern data, repeatedly by the specified number of times from the main memory 40 to the pattern cache memory 90. The instruction executing section 318 executes instruction streams from an instruction of the Ath offset of the second sequence data to an instruction of the Bth offset of the fourth sequence data repeatedly by the specified number of times.

Then, the instruction executing section 318 escapes a loop process when the loop process has been performed by the specified number of times, and executes instructions to a final offset of the fourth sequence data.

Next, the pattern generation control section 20 sequentially transfers instructions, which are located between the head and the final offsets of the fifth sequence data, from the main memory 40 to the primary cache 312. Herewith, the pattern generation control section 20 sequentially transfers test patterns, which are located between the head and the final offsets of the fifth pattern data corresponding to the fifth sequence data, from the main memory 40 to the pattern cache memory 90. Then, the instruction executing section 318 sequentially executes the instructions from the head to the final offsets of the fifth sequence data. As described above, the pattern generation control section 20 and the instruction executing section 318 transfer and execute consecutive instruction stream and test pattern stream designated in a repeated interval by the specified number of times when the repeated interval is stored on the interval register 310.

Figure 8:
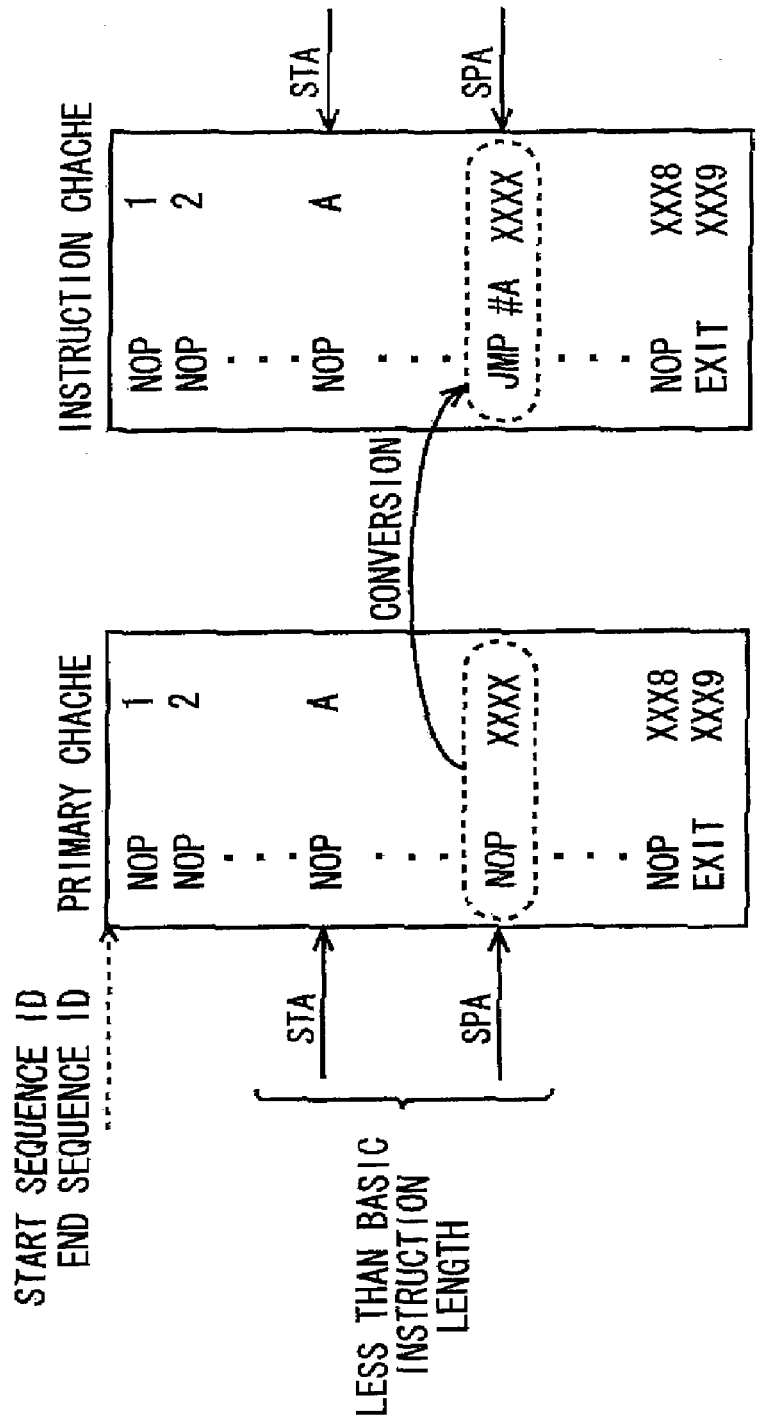
FIG. 8 is a view showing the first process example of a memory control section 314 when repeatedly executing consecutive instruction streams within one sequence data.

FIG. 8 is a view showing the first process example of the memory control section 314 when repeatedly executing consecutive instruction streams within one sequence data. In the first example, when the repeated interval is stored on the interval register 310, the memory control section 314 converts a final instruction in the repeated interval read from the primary cache 312 into a branch instruction branching to a forehand instruction in the repeated interval, and writes the converted instruction into the instruction cache 316. As an example, the memory control section 314 may convert an instruction corresponding to SPA in the sequence data shown by the end sequence ID into a JMP instruction. In this case, the memory control section 314 specifies an instruction corresponding to STA in the sequence data shown by the start sequence ID as an instruction to be executed next to the JMP instruction. In this way, according to the instruction executing section 318, it is possible to repeatedly execute instruction streams in the designated repeated interval.

Furthermore, when repeated time is specified along with repeated interval, the memory control section 314 may as an example convert a final instruction in the repeated interval into a branch instruction in which the repeated time is designated as a branch condition. In other words, the memory control section 314 may move, on condition that this instruction has not been executed by the specified number of times, the process to a forward-located executed instruction, and write, on condition that this instruction has been executed by the specified number of times, a branch instruction for terminating a repetitive operation and moving the process to a backward-located instruction into the instruction cache 316. In this way, according to the instruction executing section 318, it is possible to execute instruction streams in the specified repeated interval by the specified number of times.

As an example, the memory control section 314 may further convert the final instruction in the repeated interval read from the primary cache 312 into a branch instruction branching to the forehand instruction in the repeated interval, on condition that instruction length of the repeated interval is not more than predetermined basic instruction length. Here, as an example, predetermined basic instruction length may be the number of maximum words between a branch instruction and an instruction to be again executed by branching forward by this branch instruction. For example, predetermined basic instruction length may be the number of maximum words (for example, 512 words) capable of being returned by a JMP instruction. In this way, according to the memory control section 314, although there is a restriction that an instruction located away from the branch instruction above predetermined words cannot be specified as an instruction to be executed next to the branch instruction, it is possible to avoid writing the branch instruction contrary to the restriction into the instruction cache 316.

As an example, the memory control section 314 may further convert the final instruction in the repeated interval into the branch instruction branching to the forehand instruction in the repeated interval on condition that all instruction streams to be repeatedly executed are included in one sequence data. The memory control section 314 may convert the final instruction into the branch instruction, as an example, on condition that the start sequence ID and the end sequence ID stored on the interval register 310 become the same value. In this way, according to the memory control section 314, although there is a restriction that an instruction in difference sequence data cannot be specified as an instruction to be executed next to the branch instruction, it is possible to avoid writing the branch instruction contrary to the restriction into the instruction cache 316.

Furthermore, the memory control section 314 may sequentially read a part to be later executed in sequence data from the primary cache 312 and overwrite the part on a region storing the executed instruction that cannot be reached by front branch from a presently-running instruction in the instruction cache 316, in parallel with that the instruction executing section 318 sequentially reads and executes the sequence data from the instruction cache 316. In this way, the memory control section 314 can write an instruction stream to be executed after finishing the execution of repeated interval into the instruction cache 316 without erasing an instruction stream in the repeated interval from the instruction cache 316. As a result, the memory control section 314 can reduce a transfer burden because an instruction stream in the repeated interval may not be written into the instruction cache 316 by multiple times.

Figure 9:
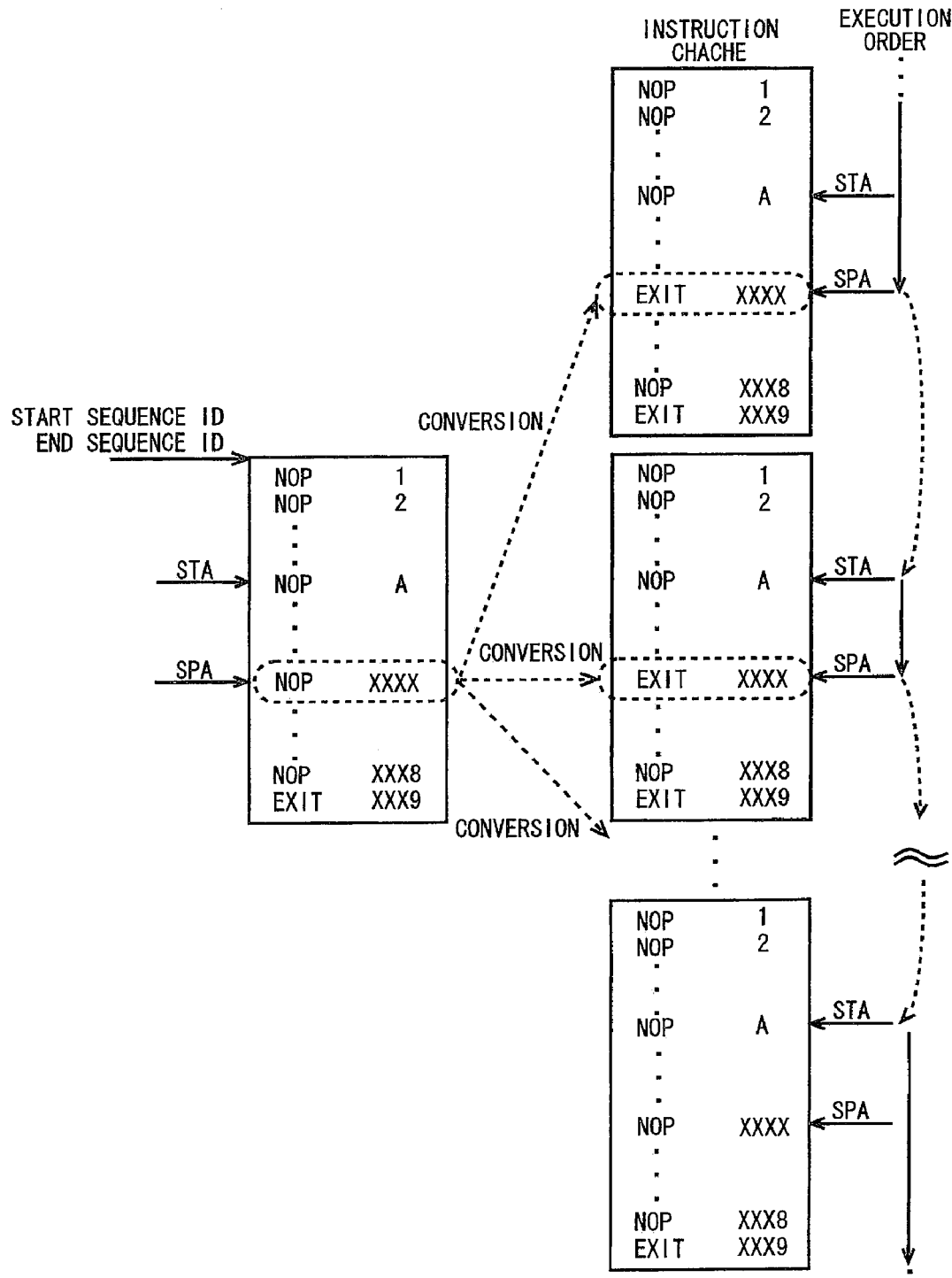
FIG. 9 is a view showing the second process example of a memory control section 314 when repeatedly executing consecutive instruction streams within one sequence data.

FIG. 9 is a view showing the second process example of the memory control section 314 when repeatedly executing consecutive instruction streams within one sequence data. In the second example, when a repeated interval is stored on the interval register 310, the memory control section 314 converts a final instruction in the repeated interval read from the primary cache 312 into a terminated instruction terminating the execution of sequence data, and writes the converted instruction into the instruction cache 316. Furthermore, the instruction executing section 318 terminates the execution of sequence data in response to the fact that the terminated instruction stored on the instruction cache 316 has been executed, and again starts the execution of sequence data in sequence from the forehand instruction in the repeated interval.

As an example, the memory control section 314 may convert an instruction corresponding to SPA in sequence data shown by an end sequence ID into an EXIT instruction. The instruction executing section 318 further terminates the execution of this sequence data in response to the fact that the EXIT instruction in the sequence data shown by the end sequence ID has been executed. Then, the instruction executing section 318 again starts instruction execution in sequence from the instruction corresponding to STA in this sequence data. According to this, the instruction executing section 318 can repeatedly execute an instruction stream in the specified repeated interval. Furthermore, according to the instruction executing section 318, although there is a restriction that an instruction located away from a branch instruction above predetermined words cannot be specified as an instruction to be executed next to the branch instruction, it is possible to repeatedly execute an instruction stream in the specified repeated interval without being contrary to this restriction.

Moreover, as an example, the pattern generation control section 20 may read an instruction stream in the repeated interval to be executed during repetition steps after the next time from the main memory 40 and write the read stream into the primary cache 312 in parallel with the fact that the instruction executing section 318 executes the instruction stream in the repeated interval. According to this, the pattern generation control section 20 makes the instruction executing section 318 continue to execute an instruction stream in a next-time repeated interval after finishing the execution of instruction stream in the first-time repeated interval.

Furthermore, when repeated time is specified along with the repeated interval, as an example, the pattern generation control section 20 may continuously write an instruction stream in the repeated interval into the primary cache 312 by the specified number of times. According to this, the pattern generation control section 20 can make the instruction executing section 318 execute an instruction stream in the specified repeated interval by the specified number of times.

Moreover, as an example, the memory control section 314 may convert a final instruction in the repeated interval into a terminated instruction on condition that instruction length of the repeated interval is longer than predetermined basic instruction length. According to this, when the instruction length of the repeated interval is not more than the predetermined basic instruction length, the memory control section 314 can use the final instruction in the repeated interval as a branch instruction. As a result, according to the memory control section 314, when the instruction length of the repeated interval is not more than the predetermined basic instruction length, it is possible to reduce a transfer burden because the instruction stream in the repeated interval may not be written into the plurality of instruction caches 316.

In addition, the instruction executing section 318 may output a vector address expressed by an offset from the head of pattern data to the pattern cache memory 90. Here, when the repeated interval is stored on the interval register 310, since the instruction executing section 318 starts executing an instruction from a halfway instruction in the sequence data, the instruction executing section 318 generates a vector address having deviated correspondence with an instruction during execution. Therefore, when executing an instruction of forehand sequence data in the repetition period even if the repeated interval is stored on the interval register 310, the instruction executing section 318 may supply a vector address obtained by adding an offset of an instruction specified by SPA to the pattern cache memory 90. According to this, the instruction executing section 318 can output a vector address designating a test pattern corresponding to an instruction during execution.

Figure 10:
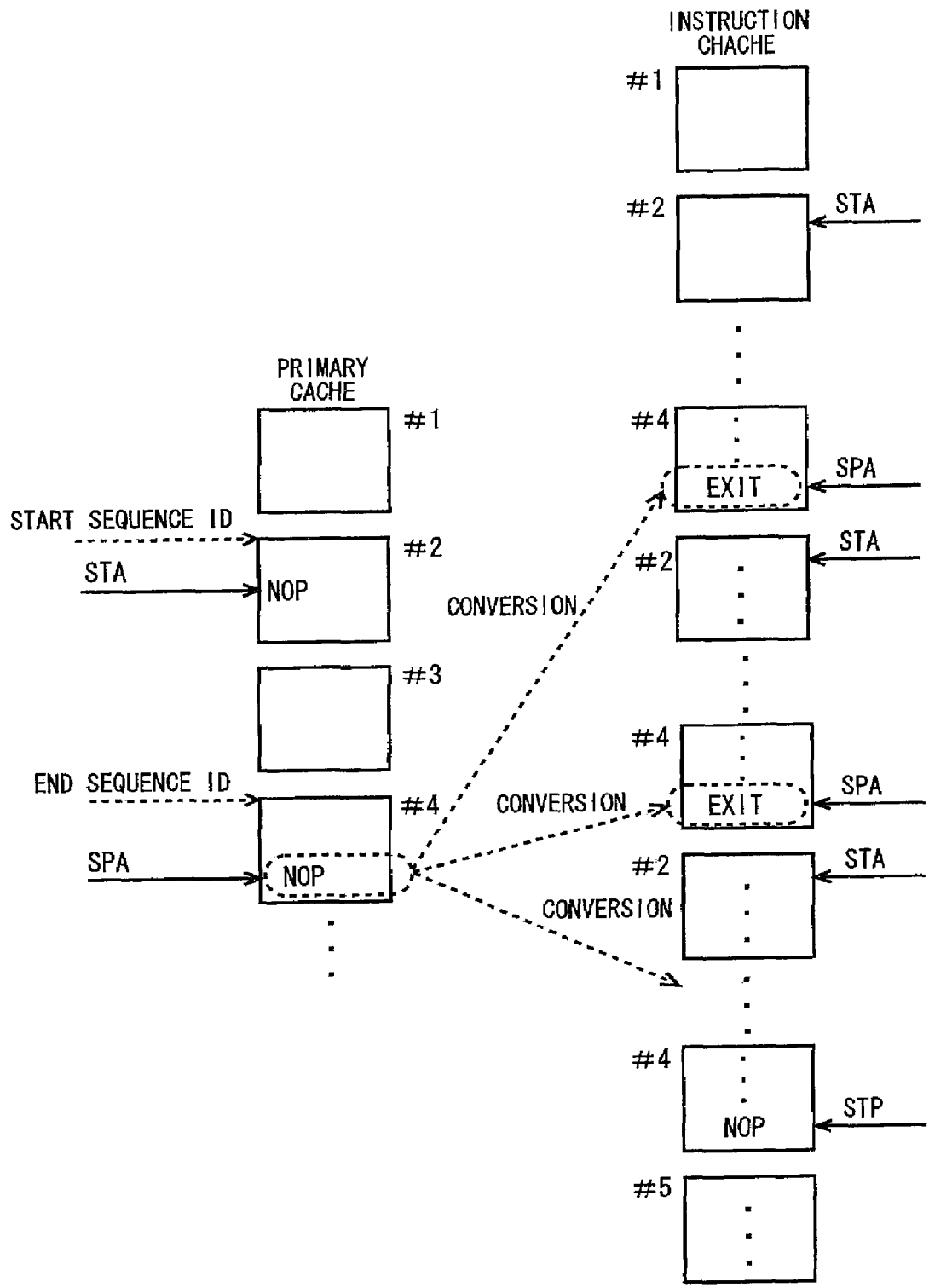
FIG. 10 is a view exemplary showing a process of a memory control section 314 when repeatedly executing consecutive instruction streams continued over a plurality of sequence data.

FIG. 10 is a view exemplary showing a process of the memory control section 314 when repeatedly executing consecutive instruction streams continued over a plurality of sequence data. As described above, the primary cache 312 may store the plurality of sequence data to be sequentially executed. Moreover, the interval register 310 may store a repeated interval designating instruction streams continued over the plurality of sequence data.

Here, when a repeated interval designating instruction streams continued over two or more sequence data is stored on the interval register 310, the memory control section 314 convert a final instruction in the repeated interval read from the primary cache 312 into a terminated instruction terminating the execution of sequence data including this instruction, and writes the converted instruction into the instruction cache 316. Furthermore, the instruction executing section 318 terminates the execution of sequence data including this terminated instruction in accordance with the fact that the terminated instruction that is stored on the instruction cache 316 and becomes the end of the repeated interval has been executed, and again executes instructions in sequence from a forehand instruction in the repeated interval in the sequence data located at the head of the repeated interval.

As an example, the memory control section 314 may convert an instruction corresponding to SPA in sequence data shown by an end sequence ID into an EXIT instruction. Furthermore, the instruction executing section 318 terminates the execution of sequence data shown by this end sequence ID in accordance with the fact that the EXIT instruction in the sequence data shown by the end sequence ID has been executed. Next, the instruction executing section 318 again starts the execution of instructions in sequence from an instruction corresponding to STA in the sequence data shown by the start sequence ID. According to this, the instruction executing section 318 can repeatedly execute an instruction stream in the repeated interval specified over the plurality of sequence data.

Moreover, as an example, in parallel with the fact that the instruction executing section 318 executes an instruction stream in a repeated interval, the pattern generation control section 20 may read an instruction stream not yet transferred in this repeated interval and an instruction stream in a repeated interval to be executed during repetition after the next time from the main memory 40, and write the instruction streams into the primary cache 312. Moreover, when repeated time is specified along with the repeated interval, as an example, the pattern generation control section 20 may continuously write the plurality of sequence data included in the repeated interval into the primary cache 312 by the specified number of times. According to this, the pattern generation control section 20 can make the instruction executing section 318 execute an instruction stream in the specified repeated interval by the specified number of times.

Figure 11:
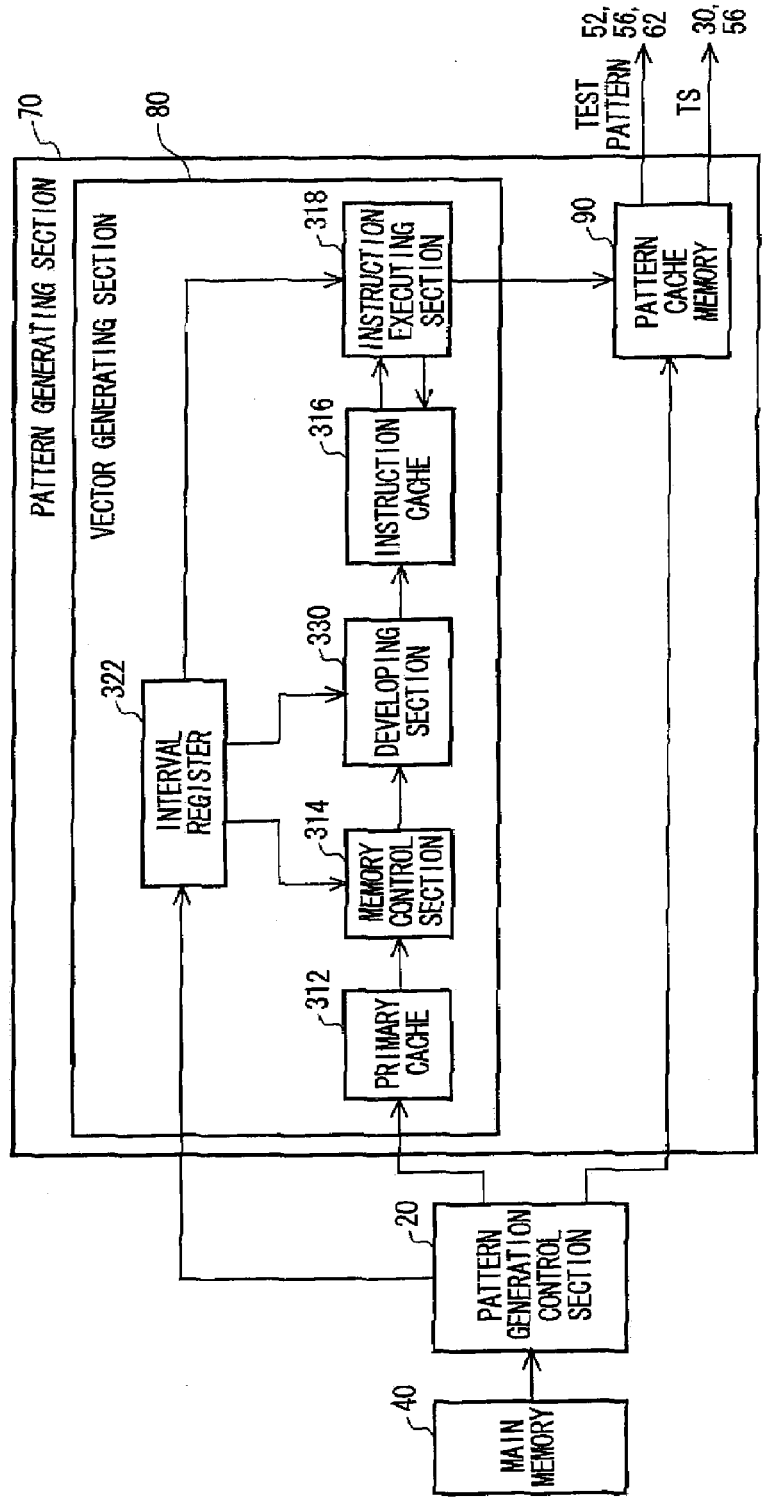
FIG. 11 is a view showing a configuration of a pattern generating section 70 according to an alternative example of the present embodiment along with a pattern generation control section 20 and a main memory 40.
Figure 12:
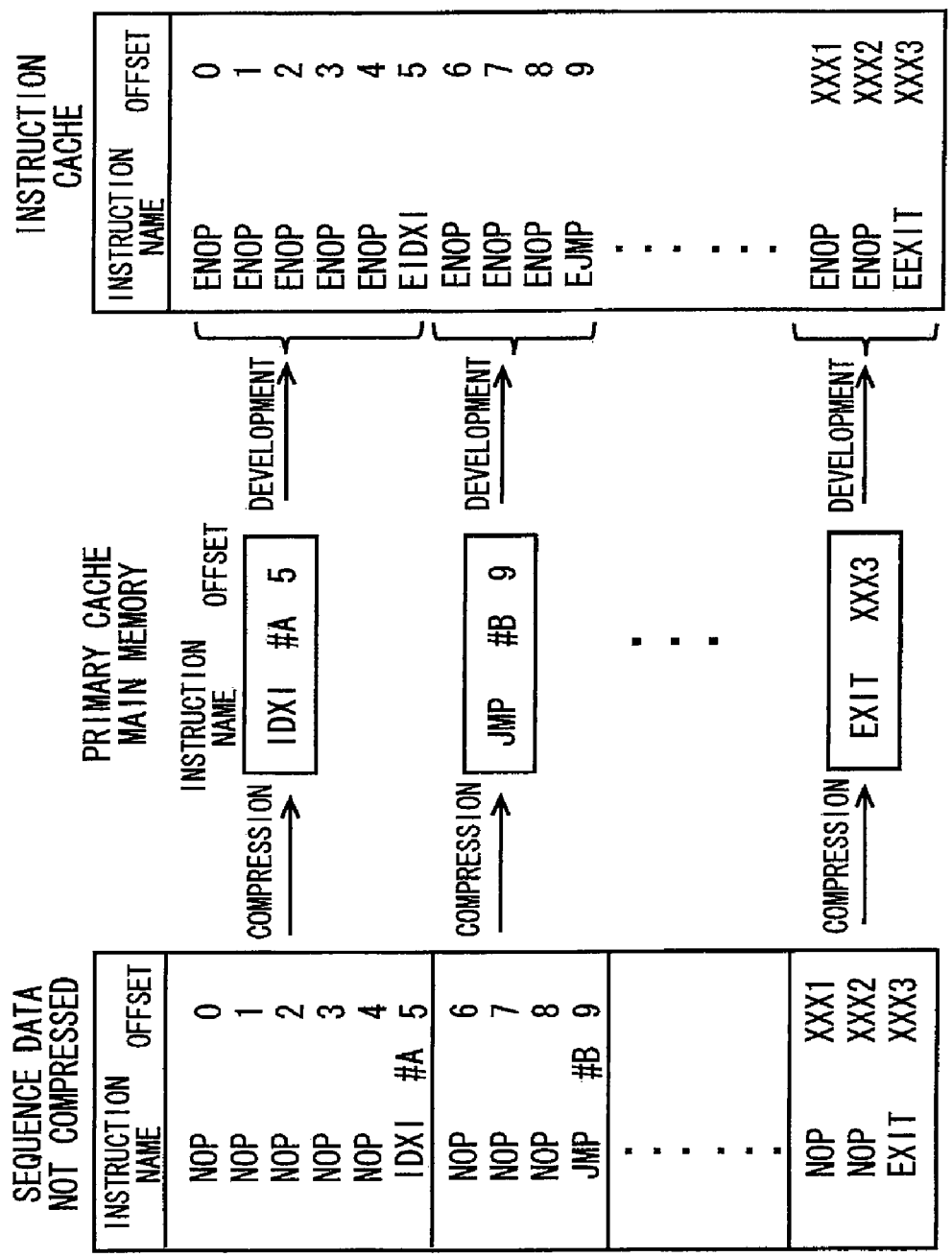
FIG. 12 is a view exemplary showing sequence data not compressed, sequence data with a compression format in which a NOP instruction is deleted, and sequence data obtained by developing sequence data with a compression format.

FIG. 11 is a view showing a configuration of the pattern generating section 70 according to an alternative example of the present embodiment along with the pattern generation control section 20 and the main memory 40. FIG. 12 is a view exemplary showing sequence data not compressed, sequence data with a compression format in which a NOP instruction is deleted, and sequence data obtained by developing sequence data with a compression format.

The present alternative example takes a configuration and a function substantially equal to those of the present embodiment described in FIGS. 1 to 10. Since members according to the present alternative example having a configuration and a function substantially equal to members described in FIGS. 1 to 10 have the same reference numerals, their descriptions will be omitted. In addition, E showing that an instruction is an instruction after development is added to the front of the name of each instruction of sequence data after development in FIG. 12.

A main memory 40 and a primary cache 312 according to the present alternative example store instructions included in sequence data, which are not an object to be compressed, in a compression format in which a NOP instruction is deleted. For example, the main memory 40 and the primary cache 312 store sequence data in which a NOP instruction is deleted from an instruction stream not compressed, that is, sequence data including instructions other than NOP such as an IDXI instruction, a JMP instruction, an EXIT instruction, or the like, as shown in FIG. 12. According to this, a test module 100 can reduce a capacity of the main memory 40 and the primary cache 312.

Furthermore, the main memory 40 and the primary cache 312 store an offset of a test pattern corresponding to each instruction in correspondence with each instruction that is not an object to be compressed. In other words, the main memory 40 and the primary cache 312 store offsets allotted in a state that each instruction is not compressed, in correspondence with each instruction (each instruction other than a NOP instruction) that is not an object to be compressed.

A vector generating section 80 further includes a developing section 330. The developing section 330 replays the deleted NOP instruction when a memory control section 314 writes sequence data read from the primary cache 312 into an instruction cache 316. More specifically, when an offset of a first instruction in sequence data read from the primary cache 312 and an offset of a second instruction stored next to the first instruction in the primary cache 312 do not continue, the developing section 330 replays a NOP instruction in correspondence with each offset between the next offset of the first instruction and the preceding offset of the second instruction.

For example, as shown in FIG. 12, it is considered that all instructions of offsets before the fourth are NOP instructions and all instructions between a fifth-offset IDXI instruction and a ninth-offset JMP instruction are NOP instructions. In other words, the sequence data stored on the main memory 40 and the primary cache 312 include the fifth-offset IDXI instruction and the ninth-offset JMP instruction and do not include NOP instructions from the first to the fourth and NOP instructions from the sixth to the eighth.

In this case, the developing section 330 replays the first to the fourth offset NOP instructions and the fifth to the ninth offset NOP instructions. According to this, the developing section 330 can convert compressed sequence data into a format capable of being executed by the instruction executing section 318 and write the converted data into the instruction cache 316.

Figure 13:
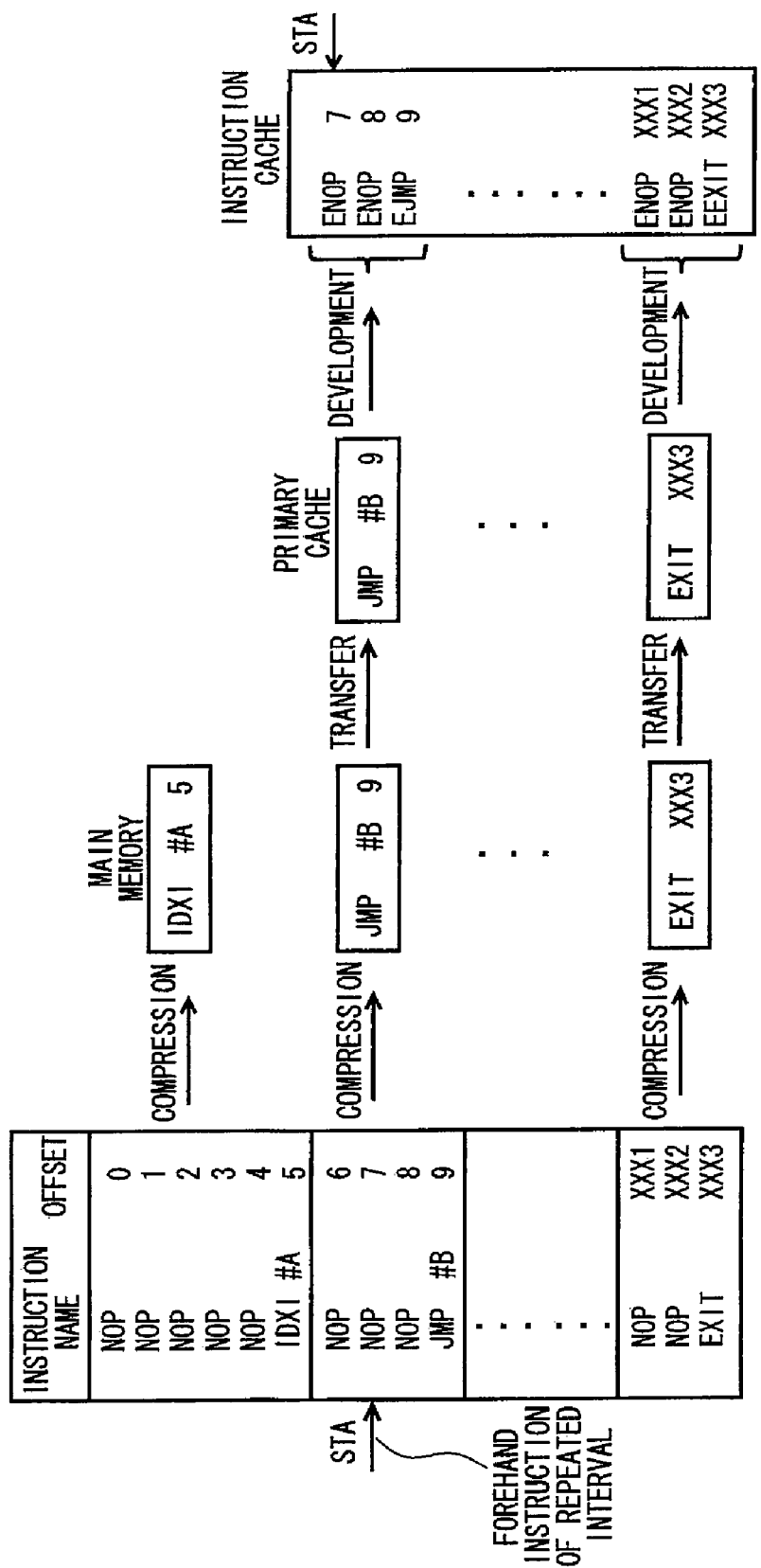
FIG. 13 is a view showing a transfer process by a pattern generation control section 20 and a developing process by a developing section 330 when a forehand instruction in a repeated interval was a NOP instruction.

FIG. 13 is a view showing a transfer process by the pattern generation control section 20 and a developing process by the developing section 330 when a forehand instruction in a repeated interval was a NOP instruction. Here, the pattern generation control section 20 transfers, in repetition after the second time, instructions after the second instruction from the main memory 40 to the primary cache 312 in response to the fact that an offset corresponding to a forehand instruction in the repeated interval is a value between an offset corresponding to the first instruction and an offset corresponding to the second instruction. Furthermore, the developing section 330 replays, in repetition after the second time, a NOP instruction in correspondence with each offset between an offset of the forehand instruction and a preceding offset of the second instruction, in response to the fact that the offset corresponding to the forehand instruction in the repeated interval is the value between the offset corresponding to the first instruction and the offset corresponding to the second instruction.

For example, as shown in FIG. 13, it is considered that all instructions between the fifth-offset IDXI instruction and the ninth-offset JMP instruction are NOP instructions and a seventh-offset NOP instruction is the forehand instruction in the repeated interval. In other words, the sequence data stored on the main memory 40 include the fifth-offset IDXI instruction and the ninth-offset JMP instruction and do not include NOP instructions from the sixth to the eighth.

In this case, the pattern generation control section 20 transfers, in repetition after the second, instructions after the ninth-offset JMP instruction from the main memory 40 to the primary cache 312. Then, the developing section 330 may not replay, in repetition after the second, NOP instructions before the fifth-offset IDXI instruction. The developing section 330 may further replay the seventh and the eighth NOP instructions and may not replay the sixth NOP instruction. According to this, the developing section 330 can replay an NOP instruction to be executed when a NOP instruction is deleted.

Figure 14:
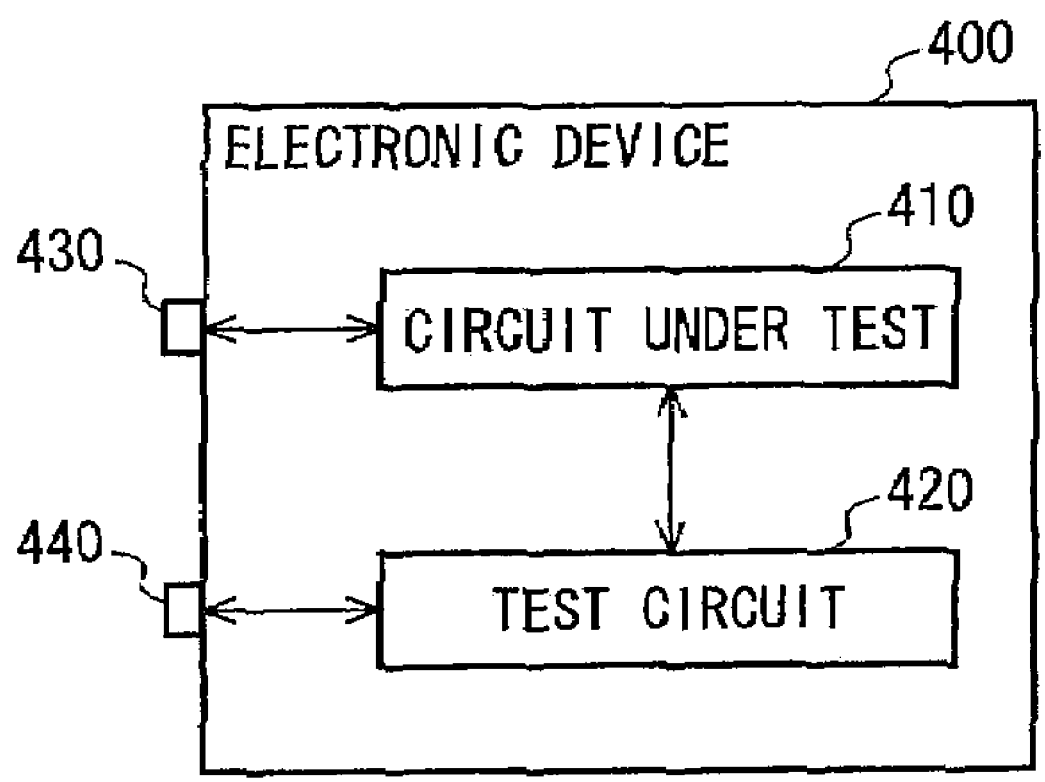
FIG. 14 is a view exemplary showing a configuration of an electronic device 400 according to an embodiment of the present invention.

FIG. 14 is a view exemplary showing a configuration of an electronic device 400 according to an embodiment of the present invention. The electronic device 400 has a circuit under test 410, a test circuit 420, an I/O pin 430, and a BIST pin 440. The circuit under test 410 may be a circuit for operating during mounting the electronic device 400. The circuit under test 410 operates in accordance with a signal provided from the I/O pin 430 during mounting the electronic device 400.

For example, when the electronic device 400 is a memory device, the circuit under test 410 may be a circuit including memory cells of the electronic device 400. For example, the circuit under test 410 may be memory cells and a control circuit for controlling the memory cells. The control circuit may be a circuit that controls writing data into the memory cell and reading data from the memory cell.

The test circuit 420 is provided in a semiconductor chip equal to the circuit under test 410, and tests the circuit under test 410. The test circuit 420 may have a configuration equal to that of the test module 100 described with reference to FIGS. 1 to 13. Moreover, the test circuit 420 may have a configuration of a part of the test module 100. Moreover, the test circuit 420 may be a circuit that performs a function of a part of the test module 100. For example, the test circuit 420 may not have the result memory 16. Moreover, the rate generating section 30 and the timing generating section 56 in the test circuit 420 may operate according to a set value of the fixed timing set.

Moreover, when a signal by which a self test of the circuit under test 410 is performed is provided from an outside test apparatus via the BIST pin 440, the test circuit 420 may test the circuit under test 410. It is preferable that the BIST pin 440 is a pin that is not used during mounting the electronic device 400. Moreover, the test circuit 420 may output a test result for the circuit under test 410 from the BIST pin 440 to the outside test apparatus.

The outside test apparatus may perform an operation similar to that of the site controller 130 described with reference to FIG. 1. In other words, a test control program, a test program, test data, and so on may be supplied to the test circuit 420, in order to make the test circuit 420 function similarly to the test module 100 described with reference to FIGS. 1 to 13.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A test apparatus that tests a device under test, comprising:
   a pattern memory that stores a test instruction stream determining a test sequence for testing the device under test;
   an interval register that stores a repeated interval in response to the fact that the repeated interval showing at least one instruction to be repeatedly executed in the test instruction stream has been specified;
   an instruction cache that caches the test instruction stream read from the pattern memory;
   a memory control section that reads the test instruction stream from the pattern memory and writes the read stream into the instruction cache;
   a pattern generating section that sequentially reads and executes instructions included in the test instruction stream from the instruction cache and generates a test pattern corresponding to the executed instruction; and
   a signal output section that generates a test signal based on the test pattern and supplies the generated test signal to the device under test, wherein
   the pattern generating section repeatedly executes an instruction stream within the repeated interval in the test instruction stream when the repeated interval is stored on the interval register.

2. The test apparatus as claimed in claim 1, wherein the memory control section converts a final instruction in the repeated interval read from the pattern memory into a branch instruction for branching to a forehand instruction in the repeated interval and writes the converted instruction into the instruction cache.

3. The test apparatus as claimed in claim 2, wherein the memory control section converts a final instruction in the repeated interval read from the pattern memory into a branch instruction for branching to a forehand instruction in the repeated interval and writes the converted instruction into the instruction cache, on condition that instruction length of the repeated interval is less than predetermined basic instruction length.

4. The test apparatus as claimed in claim 3, wherein the memory control section sequentially reads a portion to be later executed in this test instruction stream from the pattern memory and overwrites the read portion on a region in the instruction cache for storing executed instructions at which a presently-running instruction cannot arrive even by front branch, in parallel with that the pattern generating section sequentially reads and executes the test instruction stream from the instruction cache.

5. The test apparatus as claimed in claim 1, wherein
   the memory control section converts a final instruction in the repeated interval read from the pattern memory into a terminated instruction terminating the execution of the test instruction stream and writes the converted instruction into the instruction cache, and
   the pattern generating section once terminates the execution of the test instruction stream in response to the fact that the terminated instruction stored on the instruction cache has been executed and again starts the execution of the test instruction stream in sequence from a forehand instruction in the repeated interval.

6. The test apparatus as claimed in claim 5, wherein the test apparatus further comprises:
   a main memory that stores the test instruction stream; and
   a transfer section that reads the test instruction stream stored on the main memory and writes the read stream into the pattern memory in accordance with a described sequence, and
   the transfer section reads an instruction stream in the repeated interval to be executed in repetition after the next time from the main memory and writes the read stream into the pattern memory, in parallel with that the pattern generating section executes the instruction stream in the repeated interval.

7. The test apparatus as claimed in claim 1, wherein
   the pattern memory stores a plurality of test instruction streams to be sequentially executed,
   the interval register stores the repeated interval showing at least one instruction to be repeatedly executed in the plurality of test instruction streams,
   the memory control section converts a final instruction in the repeated interval read from the pattern memory into a terminated instruction terminating the execution of the test instruction stream including this final instruction and writes the converted instruction into the instruction cache when the repeated interval is specified over two or more test instruction streams, and
   the pattern generating section terminates the execution of the test instruction stream including this terminated instruction in response to the fact that the terminated instruction that is an end of the repeated interval stored on the instruction cache has been executed and again executes instructions in sequence from a forehand instruction in the repeated interval in a test instruction stream located at the head of the repeated interval.

8. The test apparatus as claimed in claim 1, wherein the pattern memory:
   further stores a test pattern sequence for testing the device under test;
   stores instructions, which are not an object to be compressed, included in the test instruction stream in a compression format in which a NOP instruction is deleted; and
   stores an offset of a test pattern corresponding to each instruction in correspondence with each instruction that is not an object to be compressed,
   the test apparatus further comprises a developing section that replays a NOP instruction in correspondence with each offset from the following offset of a first instruction to the preceding offset of a second instruction, when an offset of the first instruction in the test instruction stream read from the pattern memory and an offset of the second instruction next to the first instruction stored on the pattern memory do not continue, and
   the developing section replays, in repetition after the second, the NOP instruction in correspondence with each offset from the following offset of a forehand instruction in the repeated interval to the preceding offset of the second instruction, in response to the fact that an offset corresponding to the forehand instruction is a value between an offset corresponding to the first instruction and an offset corresponding to the second instruction.

9. An electronic device comprising:
   a circuit under test; and
   a test circuit that tests the circuit under test, and the test circuit comprising:

a pattern memory that stores a test instruction stream determining a test sequence for testing the circuit under test;

an interval register that stores a repeated interval in response to the fact that the repeated interval showing at least one instruction to be repeatedly executed in the test instruction stream has been specified;

an instruction cache that caches the test instruction stream read from the pattern memory;

a memory control section that reads the test instruction stream from the pattern memory and writes the read stream into the instruction cache;

a pattern generating section that sequentially reads and executes instructions included in the test instruction stream from the instruction cache and generates a test pattern corresponding to the executed instruction; and a signal output section that generates a test signal based on the test pattern and supplies the generated test signal to the circuit under test, wherein the pattern generating section repeatedly executes an instruction stream within the repeated interval in the test instruction stream when the repeated interval is stored on the interval register.

* * * * *